US009627739B2

(12) United States Patent
Timaru

(10) Patent No.: US 9,627,739 B2
(45) Date of Patent: Apr. 18, 2017

(54) SYSTEM FOR COUPLING PRINTED CIRCUIT BOARDS

(75) Inventor: Theodore Timaru, Plano, TX (US)

(73) Assignee: Alcatel Lucent, Boulogne-Billancourt (FR)

( * ) Notice: Subject to any disclaimer, the term of this patent is extended or adjusted under 35 U.S.C. 154(b) by 345 days.

(21) Appl. No.: 13/526,817

(22) Filed: Jun. 19, 2012

(65) Prior Publication Data

US 2013/0335932 A1    Dec. 19, 2013

(51) Int. Cl.
*H05K 5/00* (2006.01)
*H01P 5/02* (2006.01)
*H05K 1/14* (2006.01)
*H05K 1/02* (2006.01)

(52) U.S. Cl.
CPC ............. *H01P 5/028* (2013.01); *H05K 1/142* (2013.01); *H05K 1/0239* (2013.01); *H05K 2201/09145* (2013.01); *H05K 2201/09154* (2013.01); *H05K 2201/09163* (2013.01); *H05K 2201/09845* (2013.01)

(58) Field of Classification Search
CPC ................................ H05K 5/00; H04B 5/0037
USPC ................... 361/752, 792, 793, 796
See application file for complete search history.

(56) References Cited

U.S. PATENT DOCUMENTS

| 3,723,913 | A | * | 3/1973 | Seidel | H03H 7/48 333/112 |
| 5,329,263 | A | * | 7/1994 | Minami | H01P 5/185 333/116 |
| 7,019,221 | B1 | * | 3/2006 | Noda | H05K 1/141 174/255 |
| 2006/0162957 | A1 | * | 7/2006 | Kindermann | H01L 23/13 174/255 |
| 2006/0202230 | A1 | * | 9/2006 | Shimura | 257/207 |
| 2007/0225034 | A1 | * | 9/2007 | Schmidt | 455/552.1 |
| 2010/0109790 | A1 | * | 5/2010 | Tzuang et al. | 333/1 |
| 2011/0138619 | A1 | | 6/2011 | Dayan et al. | |

FOREIGN PATENT DOCUMENTS

| CN | 201667759 U | | 12/2010 |
| CN | 201830551 U | * | 5/2011 |
| DE | 101 33 588 | | 9/2002 |
| EP | 1 148 572 | | 10/2001 |
| EP | 1 783 855 | | 5/2007 |
| ES | 2 168 070 | | 5/2002 |

(Continued)

OTHER PUBLICATIONS

PCT International Search Report with Written Opinion, dated Oct. 30, 2013 for International Application No. PCT/US2013/045773.

(Continued)

*Primary Examiner* — Dion R Ferguson
*Assistant Examiner* — Mandeep S Buttar
(74) *Attorney, Agent, or Firm* — Harness, Dickey & Pierce, P.L.C.

(57) ABSTRACT

The system includes a first printed circuit board including a first transmission line, the first circuit board may be attached to a chassis and a second printed circuit board including a second transmission line, the second circuit board may be attached to the chassis and/or the first printed circuit board and the second transmission line configured to electrically couple power from the first transmission line.

20 Claims, 6 Drawing Sheets

(56) References Cited

FOREIGN PATENT DOCUMENTS

| | | |
|---|---|---|
| GB | 2 381 666 | 5/2003 |
| JP | H 10-256690 A | 9/1998 |
| JP | 2003101301 A | 4/2003 |
| JP | 2012-089935 A | 5/2012 |
| WO | WO 2011/003123 | 1/2011 |

OTHER PUBLICATIONS

International Preliminary Report on Patentability dated Dec. 23, 2014 for International Application No. PCT/US2013/045773.

* cited by examiner

RELATED ART

RELATED ART

3A

3B

RELATED ART

SYSTEM FOR COUPLING PRINTED CIRCUIT BOARDS

BACKGROUND OF THE INVENTION

Field

Embodiments relate to mechanically and electrically coupling printed circuit boards (PCBs). Embodiments relate to mechanically and electrically coupling high frequency PCBs.

Related Art

FIG. 1 illustrates a conventional PCB 105. PCB 105 may include a substrate 115 (e.g., microwave substrate) on a rigid metal layer 120. Typically, the PCB 105 includes several functional sections. For example, a PCB may include an integrated Radio Frequency (RF) transceiver. The functional sections may include several componants 110-1 to 110-$n$ to implement the function. Componants 110-1 to 110-$n$ may include, for example, passive components (e.g., resistors and capacitors) and active components (e.g., transistors and amplifiers). The functional sections may include interconnecting transmission lines 125 (e.g., microstrips or striplines).

Further, in a typical assembly housing there are many PCBs each having a different function and operating characteristics (e.g., frequency and power). For example, in addition to a (RF) transceiver there may be a Power Amplifier (PA) section each manufactured on a separate PCB with a different substrate. High frequency connections between the sections on separate PCBs are typically expensive and introduce electrical interference.

Conventionally, these connections include manually installed wires or metal strips that bridge the two PCBs. FIG. 2 illustrates this conventional interconnection system 200. As shown in FIG. 2, the system 200 includes two PCBs 105 each including a substrate 115 on which an interconnecting transmission line 125 is formed. Bridge 215 interconnects the two PCB's 105 by mechanically and electrically connecting the two interconnecting transmission lines 125.

As one skilled in the art will appreciate the conventional interconnection system 200 illustrated in FIG. 2 may be expensive to manufacture. For example, the expense associated with manually soldering the bridge 215 to each of the two interconnecting transmission lines 125. In addition, the interconnection system 200 may not be as reliable as designs require or provide the preferred electrical performances (e.g., high loss at higher frequencies).

Another conventional system utilizes connectors and/or connectors with cable between the PCBs. FIG. 3 illustrates this conventional interconnection system 300. As shown in FIG. 3A, the system 300 includes two PCBs 105 each including a substrate 115. Connector assembly 305 includes a first part (not shown) attached (e.g., soldered) to the substrate 115. Connector assembly 305 includes a second part (not shown) attached (e.g., soldered) to a cable 310. The cable 310 mechanically and electrically interconnects the two PCB's 105.

Alternatively, as shown in FIG. 3B the system 300 includes two PCBs 105 each including a substrate 115. Connector assembly 315 is attached (e.g., soldered) to one of the substrates 115. Connector assembly 320 is attached (e.g., soldered) to the other of the substrates 115. The connectors 315, 320 are mated together to mechanically and electrically interconnects the two PCB's 105.

As one skilled in the art will appreciate the conventional interconnection system 300 illustrated in FIG. 3 may be expensive to manufacture. For example, the expense associated with purchasing and/or manufacturing cable assemblies. In addition, the interconnection system 300 may not be as reliable as designs require or provide the preferred electrical performances (e.g., high loss at higher frequencies).

FIG. 4 illustrates a conventional PCB 400 having a substrate 115 (e.g., microwave substrate) on a rigid metal layer 120. As shown in FIG. 4 the substrate includes two microstrip (or stripline) formations 405, 410. The two microstrip formations 405, 410 are configured as conventional coupled transmission lines. The conventional coupled transmission lines include four ports P1-P4. Characteristics of coupled transmission lines are generally known. For example, a known characteristic is coupling factor which can be determined by equation 1:

$$C_{3,1} = -10\log\left(\frac{P_3}{P_1}\right) \text{dB} \qquad (1)$$

where:

$C_{3,1}$ is the coupling factor from port P1 (input port) to port P3 (coupled port) where port P2 is a transmitted port and port P4 is isolated (e.g., grounded);

$P_1$ is the input power at port P1 (input port); and $P_3$ is the output power at port P3 (coupled port).

As is known (and shown in equation 1), there is power relationship between ports (P1-P2) and (P3-P4). In otherwords, power is coupled across the coupled transmission lines. As is known, the electrical characteristics of the power coupled across the coupled transmission lines (e.g., frequency, voltage) is based on the physical characteristics (e.g., dielectric constant of substrate 115, width of the two microstrip formations 405, 410 and distance between the two microstrip formations 405, 410) as well as the input electrical characteristics at an input port (e.g., P1).

SUMMARY OF THE INVENTION

One embodiment includes a system for coupling printed circuit boards (PCBs). The system includes a chassis, a first printed circuit board including a first transmission line, the first circuit board being attached to the chassis and a second printed circuit board including a second transmission line, the second circuit board being attached to the chassis and the second transmission line configured to electrically couple power from the first transmission line.

Another embodiment includes a system for coupling printed circuit boards (PCBs). The system includes a first printed circuit board including a first transmission line and a first mating surface and a second printed circuit board including a second transmission line and a second mating surface configured to mate with the first mating surface, the second transmission line configured to electrically couple power from the first transmission line.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

Figure 1:
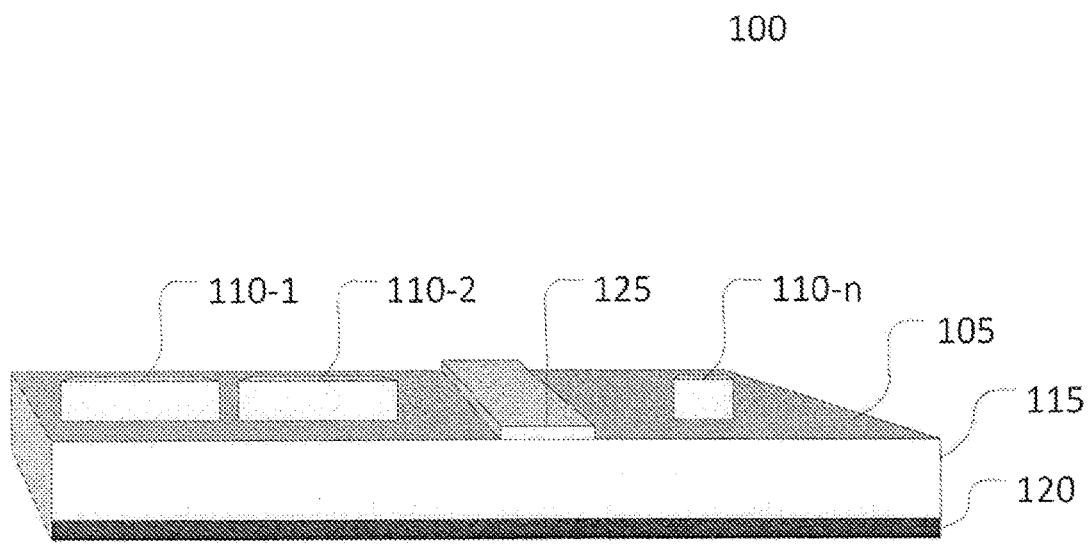
FIG. 1 illustrates a conventional printed circuit boards (PCB).

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

While example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 5:
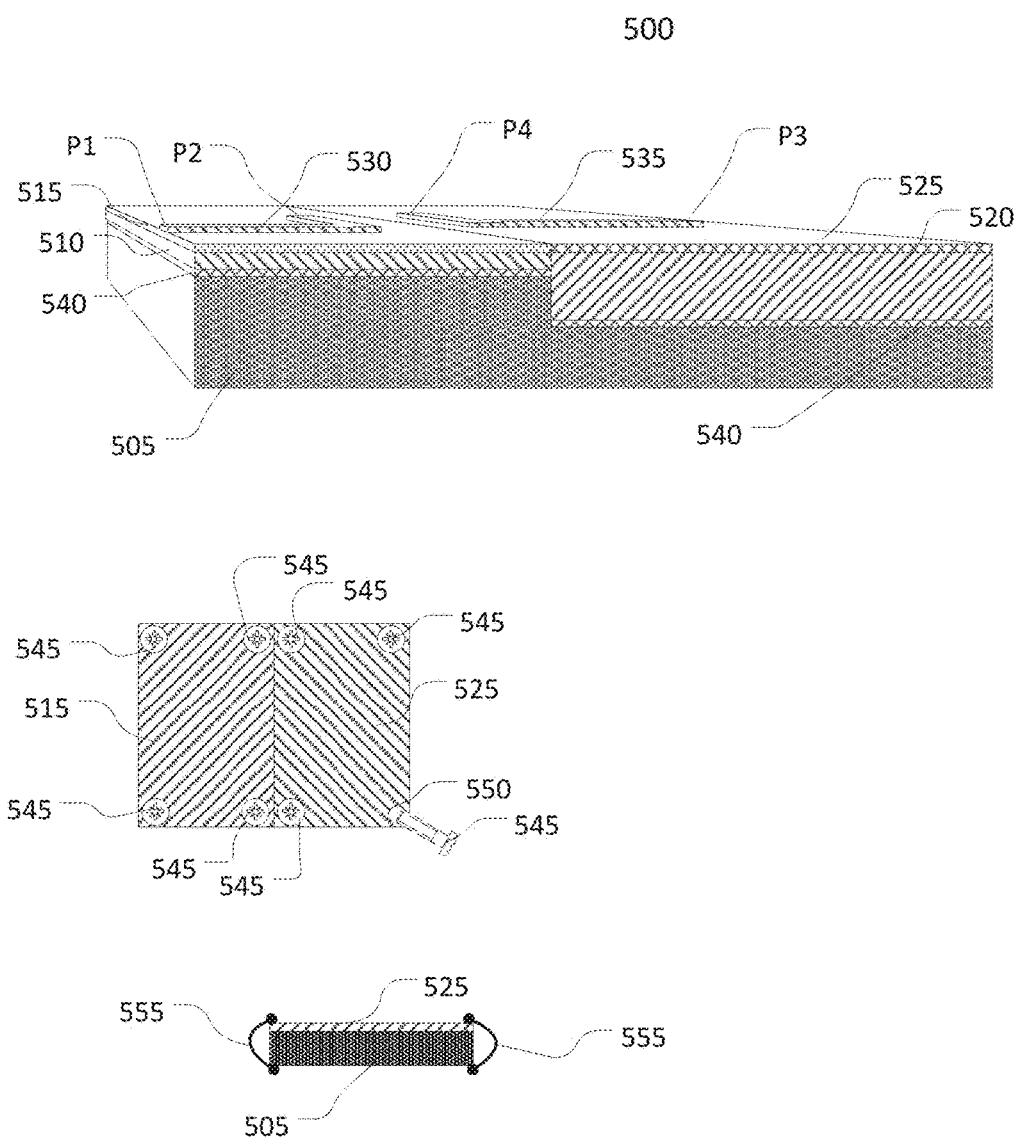
FIG. 5 illustrates a system for coupling PCBs according to example embodiments.

FIG. 5 illustrates a system for coupling printed circuit boards (PCB) according to example embodiments. The system 500 includes a chassis 505 (e.g., point-point radio chassis, smart phone chassis, base station transceiver chassis, a chassis constructed of metalized plastic or any type of chassis to mate with wireless transceivers), an adhesive layer 540, a first PCB rigid metal layer 510, a first PCB substrate 515 and a first microstrip (or stripline) formation 530. The first PCB rigid metal layer 510, the first PCB substrate 515 and the first microstrip formation 530 as a group may also be referred to as a first PCB. The system 500 further includes a second PCB rigid metal layer 520, a second PCB substrate 525 and a second microstrip (or stripline) formation 535. The second PCB rigid metal layer 520, the second PCB substrate 525 and the second microstrip formation 535 as a group may also be referred to as a second PCB.

The first PCB may have a recess into which the second PCB is inserted. The recess may be on an end of the first PCB, on an edge of the first PCB or cut out of the body of the first PCB. Alternatively, the second PCB may adjoin the first PCB on the chassis 505. The adhesive layer 540 may be a glue, an epoxy, an adhesive tape or the like. The adhesive layer 540 may adhere the first PCB and/or the second PCB to the chassis 505. Alternatively (or in addition to), the chassis 505 may include a mechanism (e.g., tie downs 555, fastener 545 with threaded hole 550) for holding the first PCB and the second PCB in place.

The first microstrip formation 530 and the second microstrip formation 535 are configured as coupled transmission lines. The description below refers to the first PCB as being a main line. In other words, ports P1 and P2 are the ports over which power (or electric signal) is applied. Further, the second PCB is a coupled line. In other words, ports P3 and P4 are the ports on which power (or electric signal) is coupled without any physical-electrical connection. One or more of ports P1-P4 may be electrically connected to a radio frequency (RF) load or to a ground potential. For example, the first PCB may be a high frequency power amplifier or radio frequency (RF) transceiver and the second PCB may be a low power and/or low frequency detector and/or any other RF circuits (power control circuit, frequency control circuit and the like).

As a result, the first PCB may be configured to operate at a first frequency and first power level with the second PCB configured to operate at a second frequency and second power level. In this case, the first frequency may be different from the second frequency and the first power level may be higher than the second power level. The aforementioned connecting principle may be used with other type of transmission lines as well: striplines, coplanar waveguide lines etc.

The shape, dimensions and/or materials of the first PCB rigid metal layer 510 and the second PCB rigid metal layer 520 are design choices. For example, the materials may include aluminium, copper (provides better heat dissipation) or any other metal/alloy that can provide a good radiofrequency ground.

The shape, dimensions and/or materials of the first PCB substrate 515 and the second PCB substrate 525 are design choices. For example, the materials may include high frequency microwave substrates like Rogers 5880, Rogers 4350, TLY-5, FR-4 and the like.

The shape, dimensions and/or materials of the first microstrip formation 530 and the second microstrip formation 535 are design choices. For example, the materials may include copper with different finishings (e.g., tin-lead, immersion tin, gold, silver). The shape of the second microstrip formation 535 may be the same or different that the first microstrip formation 530. For example, the first microstrip formation 530 and the second microstrip formation 535 are shown as having an 'L' shape. However, the shape of the second microstrip formation 535 (or portion thereof) may be, for example a series of 'T' or 'Z' shapes or a straight line of different widths based on the electrical characteristic requirements (e.g., frequency) of the second PCB.

Figure 4:
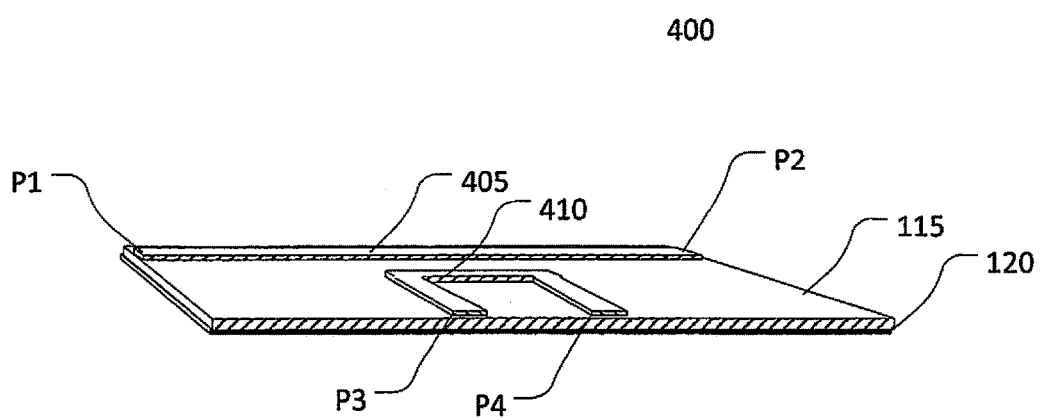
FIG. 4 illustrates a conventional PCB.

The conventional PCB including conventional coupled transmission lines (discussed above with regard to FIG. 4) include the same substrate (e.g., substrate 115) and rigid metal layer (e.g., rigid metal layer 120). Therefore, the conventional PCB is limited to varying shapes and/or materials of the coupled transmission lines to affect the electrical characteristics of the coupled signals.

However, according to example embodiments, the dimensions and/or materials of the first PCB rigid metal layer 510 as compared to the second PCB rigid metal layer 520 may be different; the dimensions and/or materials of the first PCB substrate 515 as compared to the second PCB substrate 525 may be different; in addition to the dimensions and/or materials of the first microstrip formation 530 and the second microstrip formation 535. Therefore, the system for coupling PCBs 500 according to example embodiments improves design flexibility when compared to conventional PCBs including conventional coupled transmission lines (discussed above with regard to FIG. 4).

Figure 2:
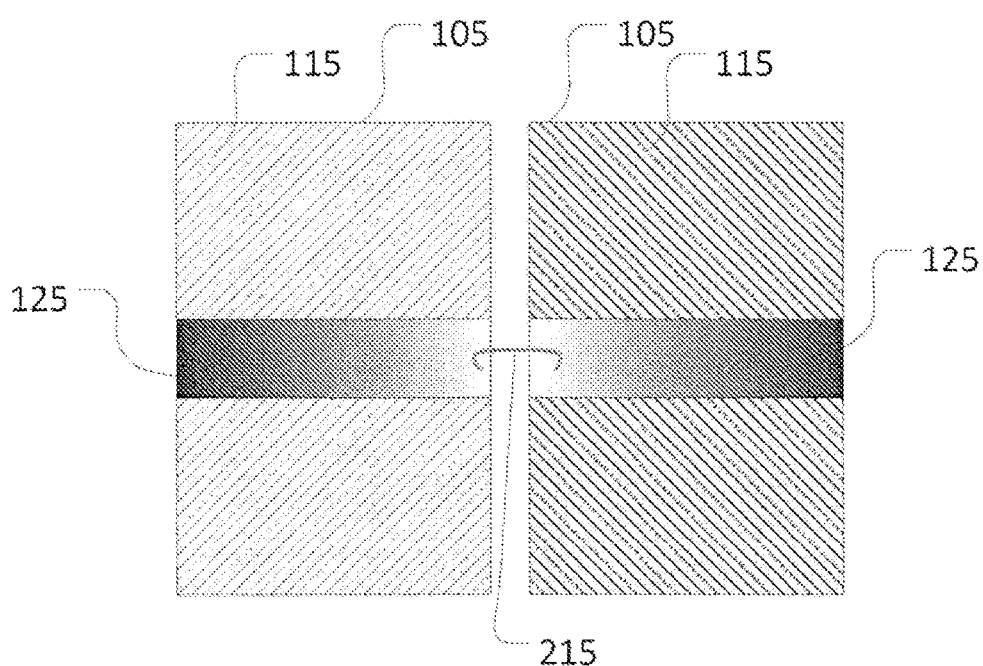
FIG. 2 illustrates a conventional PCB interconnection system.
Figure 3:
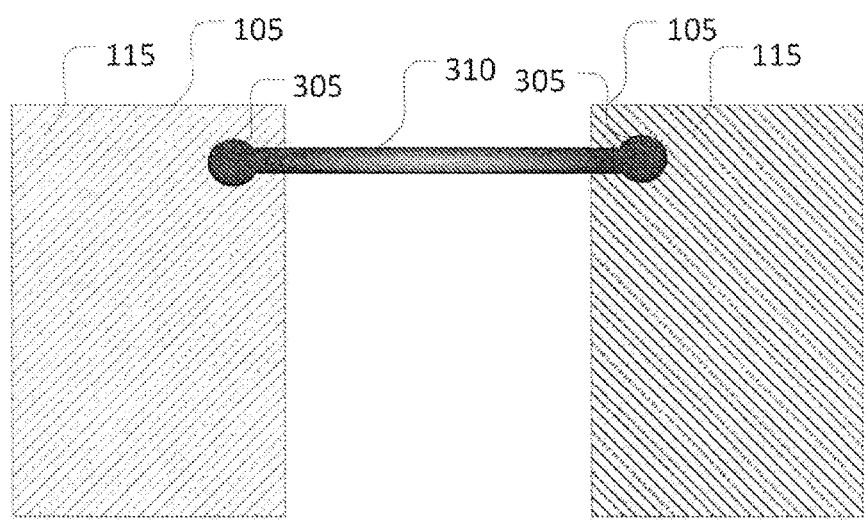
FIGS. 3A and 3B illustrate another conventional PCB interconnection system.
Figure 3:
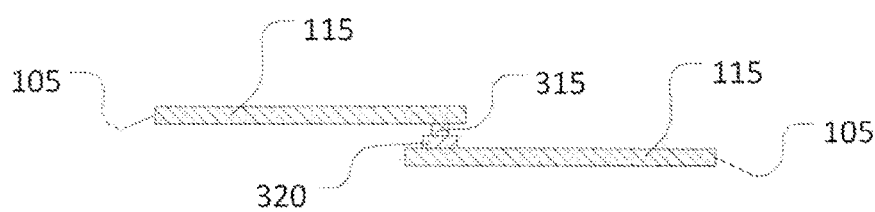

Further, by using coupled transmission lines, the system for coupling PCBs 500 according to example embodiments is an improvement over the conventional PCB interconnection system (as described above with regard to FIGS. 2 and 3) because there is no need for expensive/unreliable wire bridges and there is no need for expensive/low-performing connector-cable interconnects.

Figure 6:
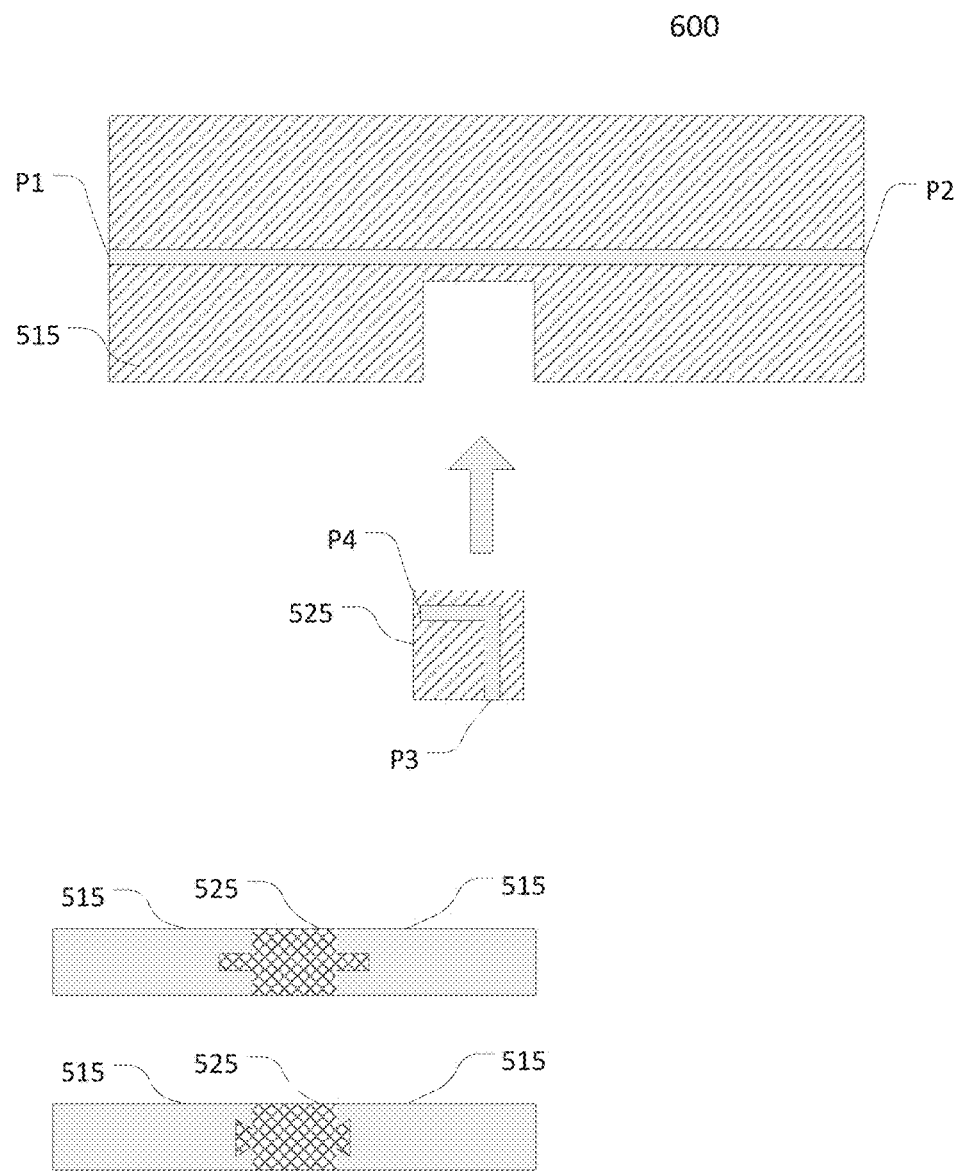
FIG. 6 illustrates another system for coupling PCBs according to example embodiments.

FIG. 6 illustrates another system for coupling printed circuit boards (PCB) according to example embodiments. For the sake of brevity, the system 600 is shown as including the first PCB substrate 515 and the second PCB substrate 525. However, system 600 may include the underlying layers shown in system 500. System 600 differs from system 500 in that instead of being assembled on chassis 505, in system 600 the second PCB substrate 525 is inserted into the first PCB substrate 515. The two substrates 515, 525 may be held together using any known mechanism. For example, in the case of mechanically separated substrates, the side views in FIG. 6 show a tongue and groove and a dove tail (as mating surfaces) for holding the two substrates 515, 525 together. In the case of multilayer assembly the two substrates may be assembled together using multilayer printed board technologies (board lamination, low temperature co-fired ceramic etc.) Alternative mating surfaces are contemplated by the example embodiments. For example, a dimple/recess mechanism may be used.

While example embodiments have been particularly shown and described, it will be understood by one of ordinary skill in the art that variations in form and detail may be made therein without departing from the spirit and scope of the claims.

The invention being thus described, it will be obvious that the same may be varied in many ways. Such variations are not to be regarded as a departure from the invention, and all such modifications are intended to be included within the scope of the invention.

I claim:

1. A system comprising: a chassis; a first printed circuit board including a first transmission line having a first longitudinal axis, the first printed circuit board being attached to the chassis; and a second printed circuit board including a second transmission line having a second longitudinal axis, the second printed circuit board and the second transmission line being configured to place the first and second longitudinal axes adjacent and parallel to each other such that when the first transmission line is energized with a radio frequency signal, sufficient power is transferred from the first transmission line to the second transmission line to power a radio frequency device on the second printed circuit board.

2. The system of claim 1, wherein the chassis is configured to mate with wireless transceivers.

3. The system of claim 1, wherein the first transmission line and the second transmission line are high frequency transmission lines.

4. The system of claim 1, wherein the first transmission line and the second transmission line are microstrip transmission lines.

5. The system of claim 1, wherein
the first printed circuit board includes a first rigid metal layer and a first substrate,
the first transmission line is on the first substrate,
the second printed circuit board includes a second rigid metal layer and a second substrate, and
the second transmission line is on the second substrate.

6. The system of claim 5, wherein the first substrate and the second substrate each include at least one dimension that is not the same.

7. The system of claim 1, wherein
the first printed circuit board is configured to operate at a first frequency and first power level, and
the second printed circuit board is configured to operate at a second frequency and second power level, the first frequency being different from the second frequency and the first power level being higher than the second power level.

8. The system of claim 1, wherein the system is a wireless transceiver.

9. A system comprising: a first printed circuit board including a first transmission line having a first longitudinal axis and a first mating surface; and a second printed circuit board including a second transmission line having a second longitudinal axis and a second mating surface configured to mate with the first mating surface, the second transmission line being configured to place the first and second longitudinal axes adjacent and parallel to each other such that when the first transmission line is energized with a radio frequency signal, sufficient power is transferred from the first transmission line to the second transmission line to power a radio frequency device on the second printed circuit board.

10. The system of claim 9, wherein the first transmission line and the second transmission line are high frequency transmission lines.

11. The system of claim 9, wherein the first transmission line and the second transmission line are microstrip transmission lines.

12. The system of claim 9, wherein
the first printed circuit board includes a first rigid metal layer and a first substrate,
the first transmission line is on the first substrate,
the second printed circuit board includes a second rigid metal layer and a second substrate, and
the second transmission line is on the second substrate.

13. The system of claim 12, wherein the first substrate and the second substrate each include at least one dimension that is not the same.

14. The method of claim 9, wherein the system is a wireless transceiver.

15. The system of claim 9, wherein
the first printed circuit board is configured to operate at a first frequency and first power level, and
the second printed circuit board is configured to operate at a second frequency and second power level, the first frequency being different from the second frequency and the first power level being higher than the second power level.

16. The system of claim 1, wherein said second printed circuit board is configured to operate at a first frequency and a first power level, and said first printed circuit board is configured to operate at a second different frequency and a higher power level.

17. The system of claim 1, wherein one or more of the ports P1, P2, P3 and P4 is connected to a ground potential.

18. A method, comprising: providing a first circuit board having a first transmission line having a first longitudinal axis formed thereon; providing a second printed circuit board having a second transmission line having a second longitudinal axis formed thereon; and locating the first and second circuit boards such that the first and second transmission lines are configured to place the first and second longitudinal axes adjacent and parallel to each other such that when the first transmission line is energized with a radio frequency signal, sufficient power is transferred from the first transmission line to the second transmission line to power a radio frequency device on the second printed circuit board.

19. The method of claim 18, wherein said second printed circuit board is configured to operate at a first frequency and a first power level, and said first printed circuit board is configured to operate at a second different frequency and a higher power level.

20. The method of claim 18, wherein one or more of the ports P1, P2, P3 and P4 is connected to a ground potential.

* * * * *